United States Patent
Wang et al.

(10) Patent No.: US 7,420,835 B2
(45) Date of Patent: Sep. 2, 2008

(54) SINGLE-PORT SRAM WITH IMPROVED READ AND WRITE MARGINS

(75) Inventors: Dao-Ping Wang, Hsinchu (TW); Ping-Wei Wang, Hsin-Chu (TW)

(73) Assignee: Taiwan Semiconductor Manufacturing Co. Ltd., Hsin-Chu (TW)

(*) Notice: Subject to any disclaimer, the term of this patent is extended or adjusted under 35 U.S.C. 154(b) by 106 days.

(21) Appl. No.: 11/607,509

(22) Filed: Nov. 30, 2006

(65) Prior Publication Data

US 2008/0130380 A1  Jun. 5, 2008

(51) Int. Cl.
*G11C 11/00* (2006.01)

(52) U.S. Cl. .................. 365/154; 365/189.011; 365/156; 365/189.16

(58) Field of Classification Search .......... 365/154, 365/189.011, 156, 191, 189.02, 189.16
See application file for complete search history.

(56) References Cited

U.S. PATENT DOCUMENTS 7,366,007 B2 * 4/2008 Kanehara .............. 365/154
2007/0109878 A1 * 5/2007 Gouin et al. ........... 365/189.11
2008/0043544 A1 * 2/2008 Liaw et al. ............. 365/191

OTHER PUBLICATIONS

Seevinck, Evert et al., „Static-Noise Margin Analysis of MOS SRAM Cells, IEEE Journal of Solid-State Circuits, vol. SC-22, No. 5, Oct. 1987, pp. 748-754.

* cited by examiner

*Primary Examiner*—Son Dinh
*Assistant Examiner*—Toan Le
(74) *Attorney, Agent, or Firm*—K & L LLP

(57) ABSTRACT

The present invention relates generally to an integrated circuit (IC) design, and more particularly to a method and apparatus for providing an SRAM cell with improved read and write margins. The method includes providing a first negative voltage to a bit-line and a supply voltage to an inverse bit-line to increase a first potential difference between the bit-line and the inverse bit-line during a write operation of a logic "0." The method also includes providing the first negative voltage to the inverse bit-line and the supply voltage to the bit-line to increase the first potential difference during a write operation of a data "1."

18 Claims, 6 Drawing Sheets

SINGLE-PORT SRAM WITH IMPROVED READ AND WRITE MARGINS

BACKGROUND

The present invention relates generally to an integrated circuit (IC) design, and more particularly to an SRAM device with improved read and write margins.

In deep sub-micron technology, an embedded SRAM, such as an SRAM, has become a very popular storage unit for high-speed communication devices, image processing devices, and other system-on-chip (SOC) products. Two of the most important aspects in designing an SRAM cell are the cell area and the cell stability. The cell area determines about two-thirds of the total chip area of the SRAM, while the cell stability determines the soft-error rate and the tolerance of the memory to variations of the manufacturing process and operating conditions.

A conventional SRAM device is often implemented with a column-based dynamic power supply to provide its memory cells with various levels of supply voltage for read and write operations. This column-based dynamic power supply may cause low read and write margins particularly when the device is operating at a low supply voltage condition. A set of transistor switches along with a logic control circuit used for controlling the switches are requisite to control the power supply for each column of the cells within a memory array. These extra circuits may be larger in physical size, and thus can occupy a large layout area. As the size of SRAM continues to shrink as the technology advances, the read and write margins will be further decreased due to device mismatches and process variations. For example, a process variation may alter the device physics such that the read and write margins may become too narrow to be reasonably practicable.

Desirable in the art of integrated circuit designs are apparatus and methods for increasing the read and write margins for a single-port SRAM device while also reducing the layout area of the device.

SUMMARY

The present invention relates generally to an integrated circuit (IC) design, and more particularly to an SRAM device with improved read and write margins. In view of the foregoing, embodiments of this invention provide a single-port SRAM device having an improved read/write margin and reduced layout area. Merely by way of example, the invention has been applied to an SRAM device. However, it would be recognized that the invention has a much broader range of applicability as well.

In a specific embodiment, the invention provides a method for operating a single-port SRAM device coupled with a bit-line, an inverse bit-line, a supply voltage, and a device ground. The method includes providing a first voltage to a bit-line and a supply voltage to an inverse bit-line for increasing a first potential difference between the bit-line and the inverse bit-line during a write operation of a "0." The method also includes providing the first voltage to the inverse bit-line and the supply voltage to the bit-line for increasing the first potential difference during a write operation of a "1." By using this invention, a conventional supply voltage switch and a logic control circuit designed at least for the purpose of detecting column addresses and providing control signals to switch the supply voltage between a read operation and a write operation may be eliminated, thereby reducing overall device size.

In another embodiment, the invention provides a write buffer for generating a negative voltage for a write operation of a single-port SRAM device coupled with a data line, a data-bar line, a supply voltage, and a device ground is disclosed. The write buffer includes a first inverter and a second inverter coupled in series, an output signal of the second inverter being provided to the data line through a first NMOS pass-gate transistor. The invention further includes a third inverter, an output signal of the third inverter being provided to the data-bar line through a second NMOS pass-gate transistor, wherein a data input signal that determines the states of the data line and the data-bar line is provided to the first inverter and the third inverter. In addition, the invention includes a boosting capacitor being adapted to generate the negative voltage when a write control signal is switched high, wherein the first NMOS pass-gate transistor and the second NMOS pass-gate transistor are turned on when the write control signal is switched high. The invention further includes a fourth inverter being adapted to provide an inverted write control signal to the boosting capacitor and a multiplexer for providing the negative voltage generated by the boosting capacitor to the data line and the supply voltage to the data-bar line during a write operation of a "0" when the data input signal is low and the write control signal is high.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, or resort to the claims being necessary to determine such inventive subject matter. The construction and method of operation of the invention, however, together with additional objects and advantages thereof will be best understood from the following description of specific embodiments when read in connection with the accompanying drawings.

BRIEF DESCRIPTION OF THE DRAWINGS

The invention is herein described with reference to the accompanying drawings. The drawings depict various preferred embodiments of the present invention for purposes of illustration only. One skilled in the art will readily recognize from the following discussion that alternative embodiments of the structures and methods illustrated herein may be employed without departing from the principles of the invention described herein.

DESCRIPTION

The present invention relates generally to an integrated circuit (IC) design, and more particularly to an apparatus and method for providing an SRAM device with improved read and write margins. For purposes of description, the invention is applied to a single-port SRAM device as an example. However, it is understood that the invention can be applied to other integrated circuits as well. The following will provide a detailed description of an apparatus and method for improving performance of a single-port SRAM device by increasing its read and write margins and reducing the layout area thereof.

Figure 1:
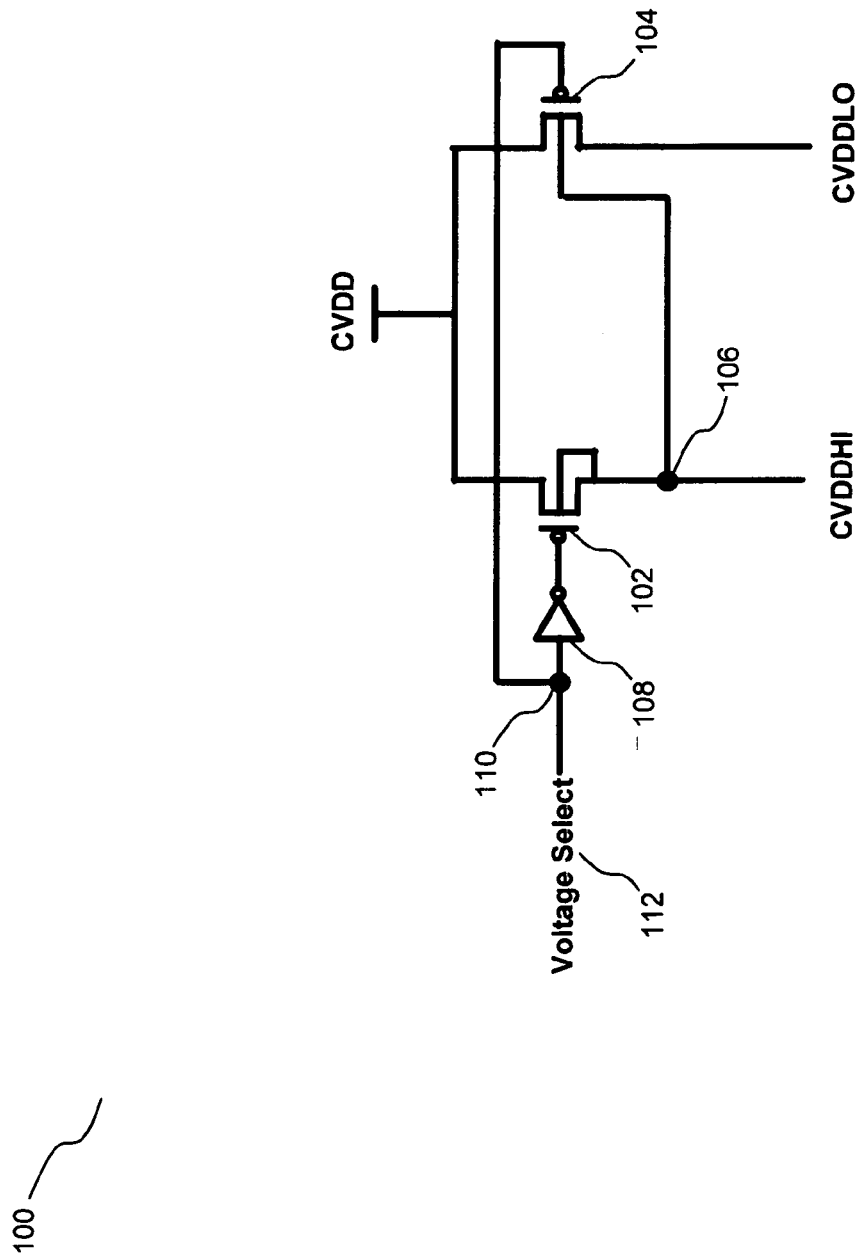
FIG. 1 illustrates a conventional supply voltage switch circuit that provides a single-port SRAM cell with various levels of supply voltage.

FIG. 1 illustrates a conventional supply voltage switch circuit that provides a single-port SRAM cell with various levels of supply voltage. Referring to FIG. 1, a circuit diagram of a conventional supply voltage switch circuit 100 designed for providing a single-port SRAM cell with various levels of supply voltage, such as CVDDHI or CVDDLO, is shown. The conventional supply voltage switch circuit 100 comprises two PMOS transistors 102 and 104 that act as a pair of switches used for selecting a desired voltage level, CVDDHI or CVDDLO, to be supplied to the SRAM cells. The voltage CVDDHI is a voltage level higher than a supply voltage Vcc, and it is supplied to a SRAM cell array's supply voltage CVDD during read operation. The voltage CVDDLO is a voltage level lower than the supply voltage Vcc, and it is supplied to a SRAM cell array's supply voltage CVDD during write operation.

The drains of the PMOS transistors 102 and 104 are coupled to CVDD to provide an array of SRAM cells with a high voltage CVDDHI or a low voltage CVDDLO in response to a voltage select signal 112. The substrates or bulks of both PMOS transistors 102 and 104 are tied together with the source of the PMOS transistor 102 at a node 106. This conventional supply voltage switch circuit 100 selects one of two different voltage levels, CVDDHI and CVDDLO, depending on which one of the PMOS transistors 102 and 104 is turned on. The conventional supply voltage switch circuit 100 allows either the PMOS transistor 102 or the PMOS transistor 104 to be turned on according to the voltage select signal 112 at any given time. An inverter 108 is implemented to provide the gate of the PMOS transistor 102 with an inverted voltage select signal while the gate of the PMOS transistor 104 receives the voltage select signal 112 directly from a node 110.

When the voltage select signal 112 is in a high state, the PMOS transistor 102 is turned on and the PMOS transistor 104 is turned off, thereby allowing the higher voltage CVDDHI to be provided to the SRAM cell array as supply voltage CVDD. When the voltage select signal is in a low state, the PMOS transistor 102 is turned off and the PMOS transistor 104 is turned on, thereby allowing the lower voltage CVDDLO to be supplied to the SRAM cells as supply voltage CVDD.

One problem with the conventional SRAM device is that the read and write margins decrease when the SRAM cells operate in a low supply voltage condition. As the dimension of SRAM device continues to shrink, the read and write margins tend to further decrease due to issues such as device mismatch and process variation. Yet another problem with the conventional SRAM cell structure is that it needs a large layout area for implementing the voltage switch circuit that switches voltages between CVDDHI and CVDDLO for read or write operation of the SRAM cells.

Figure 2:
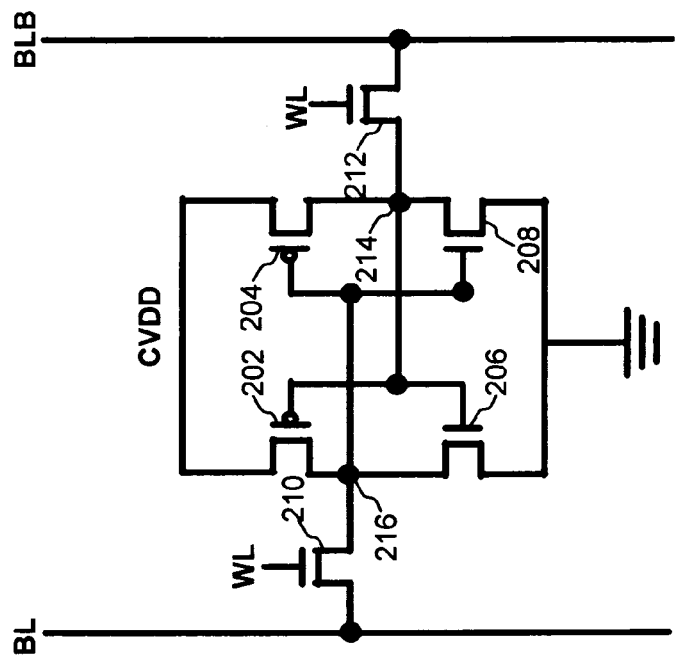
FIG. 2 illustrates a single-port SRAM cell in accordance with one embodiment of the present invention.

FIG. 2 illustrates a single-port SRAM cell in accordance with one embodiment of the present invention. The single-port SRAM cell 200 comprises two PMOS transistors 202 and 204, as well as four NMOS transistors 206, 208, 210, and 212. The PMOS transistors 202 and 204 are used as pull-up devices, the NMOS transistors 206 and 208 are used as pull-down devices, and the NMOS transistors 210 and 212 are used as pass-gate devices. The PMOS transistors 202 and 204, together with the NMOS transistors 206 and 208, form a pair of cross-coupled inverters where a value "0" or "1" can be latched.

The sources of the PMOS transistors 202 and 204 are both connected to a supply voltage CVDD while the sources of the NMOS transistors 206 and 208 are both connected to a complementary supply voltage, such as ground or Vss. The gates of the PMOS transistor 202 and the NMOS transistor 206 are coupled at a node 214, and their drains are tied together at a node 216. The gates of the PMOS transistor 204 and the NMOS transistor 208 are also coupled at the node 216, and their drains at the node 214. The node 214 is coupled to an inverse bit-line BLB via the NMOS transistor 212. The NMOS transistor 212 is controlled by a word-line WL. The node 216 is coupled to a bit-line BL via the NMOS transistor 210 that is also controlled by the same word-line WL.

In one embodiment of the present invention, data can be written into a single-port SRAM device with a higher write margin by adjusting the voltage on the bit-line BL. For example, when a value "0" is to be written into a SRAM cell, the bit-line can be supplied with a negative voltage, thus creating a large difference in potential between the bit-line and the supply voltage of the SRAM cell, as it will be further described with reference to FIG. 4B. With a negative voltage on the bit-line BL, a value "0" can be written into the SRAM cell 200 with a much higher margin. However, 0 V may still be applied to the bit-line to write a value "0" if an allowable write margin can be obtained without supplying the negative voltage. According to an embodiment of the present invention, when the supply voltage is at or larger than 1.1 V, the write margin turns out to be larger than 100 mV, a margin which is not obtainable by the conventional method. When the word-line control signal is switched high, both NMOS transistors 210 and 212 are turned on, thereby allowing the negative voltage from the bit-line BL to quickly turn on the PMOS transistor 204. This allows the supply voltage CVDD to reach the node 214, thereby turning on the NMOS transistor 206 and pulling the node 216 low to the ground, such that the SRAM cell 200 can latch a low voltage of logic "0".

When a column of SRAM cells is selected for read operation, the supply voltage CVDD of the selected cell is switched to a higher voltage level CVDDHI with the help of an additional internal voltage source, which is not shown in this figure. By increasing the supply voltage, the read margin of the selected SRAM cell can be increased since the higher supply voltage CVDDHI will be higher than the voltage on the bit-line BL, thereby ensuring that a correct value is read from the cell through the bit-line BL. According to an embodiment of the present invention, when the supply voltage is at or larger than 1.1V, a typical read margin turns out to be larger than 345 mV, a margin which is not obtainable by the conventional method. It is noted that the non-selected columns of the SRAM cells can also be supplied with the same higher voltage level CVDDHI.

Figure 3:
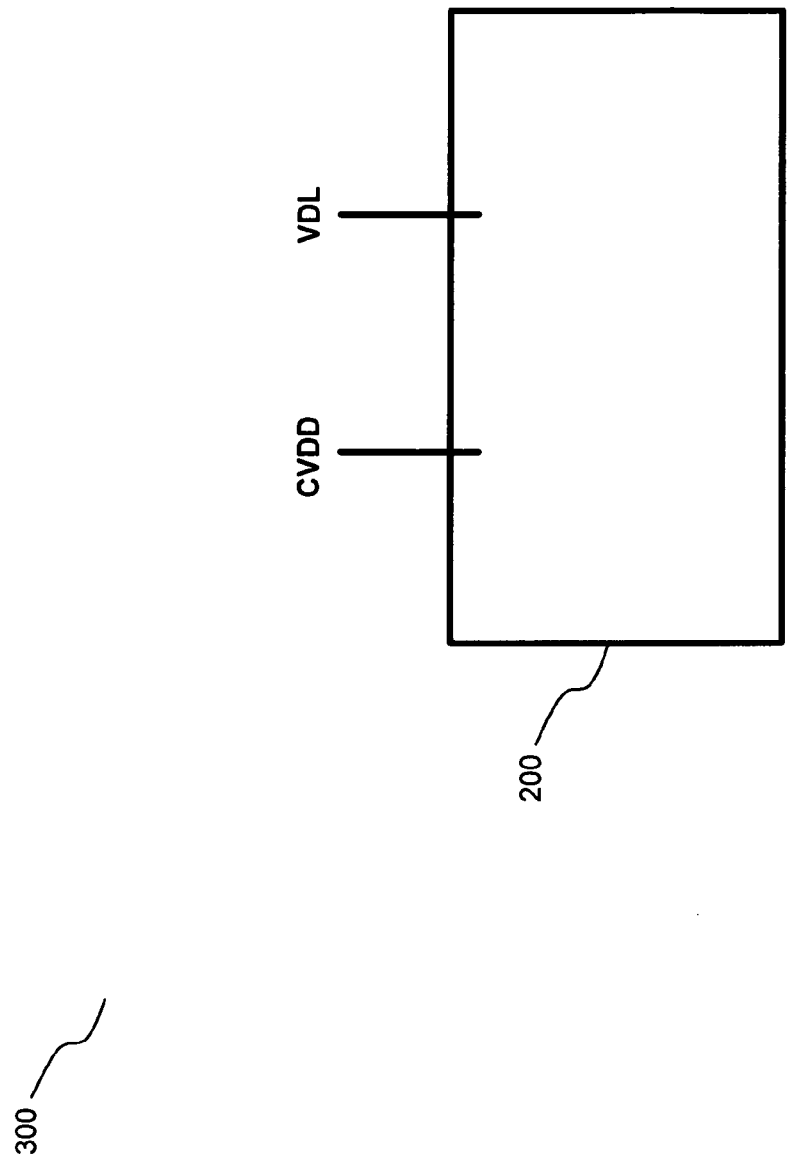
FIG. 3 illustrates a single-port SRAM cell with an additional high-voltage port (VDL) in accordance with one embodiment of the present invention.

FIG. 3 illustrates a diagram 300 showing the single-port SRAM cell 200 with a voltage port VDL in accordance with one embodiment of the present invention. The voltage port VDL may provide a voltage that is either higher than the highest possible supply voltage CVDD for read operation or a voltage that is lower than the complementary supply voltage, such as ground, for write operation. The read margin can be increased by implementing an additional voltage port VDL that can be used to supply a higher supply voltage CVDDHI to the SRAM cell during a read operation. Whenever a column is selected for read operation, its relative cells' CVDD will switch to CVDDHI. If the column is not-selected, its CVDD can also switch to CVDDHI, and thus the CVDD can be directly coupled to CVDDHI without using the switch circuit for the CVDDHI. This in turn can increase the potential difference between the supply voltage and the bit-line BL, thereby allowing the value to be read correctly. While the column is selected for write operation, its bit-line BL will write a negative voltage into the selected cell, thereby improving the write margin.

By using these two techniques to increase the write and read margins of a SRAM cell, the conventional supply voltage switch circuit 100 can be eliminated. Furthermore, this method also allows the IC designer to remove a dedicated logic circuit (not shown) typically used for detecting column addresses and providing a voltage select signal to control the supply voltage switch circuit 100. By removing both the conventional supply voltage switch 100 and the dedicated logic circuit, the layout area of a SRAM device can be significantly reduced.

Figure 4A:
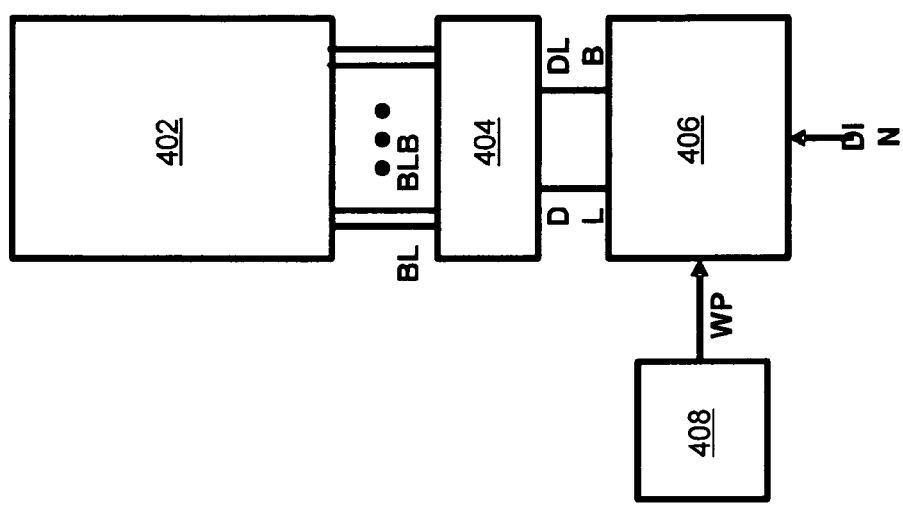
FIG. 4A illustrates a block diagram of a write path architecture used for providing a bit-line pair with a desired level of voltage during write operation in accordance with one embodiment of the present invention.

FIG. 4A illustrates a block diagram of a write path architecture used for providing a bit-line pair with a desired level of voltage during write operation in accordance with one embodiment of the present invention. The block diagram 400 includes an SRAM cell array 402, a column decoder 404, a write buffer 406, and a write pulse generator 408. The SRAM cell array 402 contains multiple columns of SRAM cells, and each column is paired with a bit-line BL and an inverse bit-bar line BLB, which are used for providing a necessary write voltage during write operation.

The write buffer 406, featured with a negative voltage booster, is designed to provide a data line DL and an inverse data line DLB with positive and negative voltages based on an input data signal DIN. In the column decoder block 404, the signals on the data line DL and the inverse data line DLB are passed on to the bit-lines BLs and inverse bit-lines BLBs of the selected columns of SRAM cells within the SRAM cell array 402 according to the addressing information provided by a controller, which is not shown in this diagram. The write pulse generator 408 is designed to provide the write buffer 406 with a write control signal WP that enables or disables the write operation.

Figure 4B:
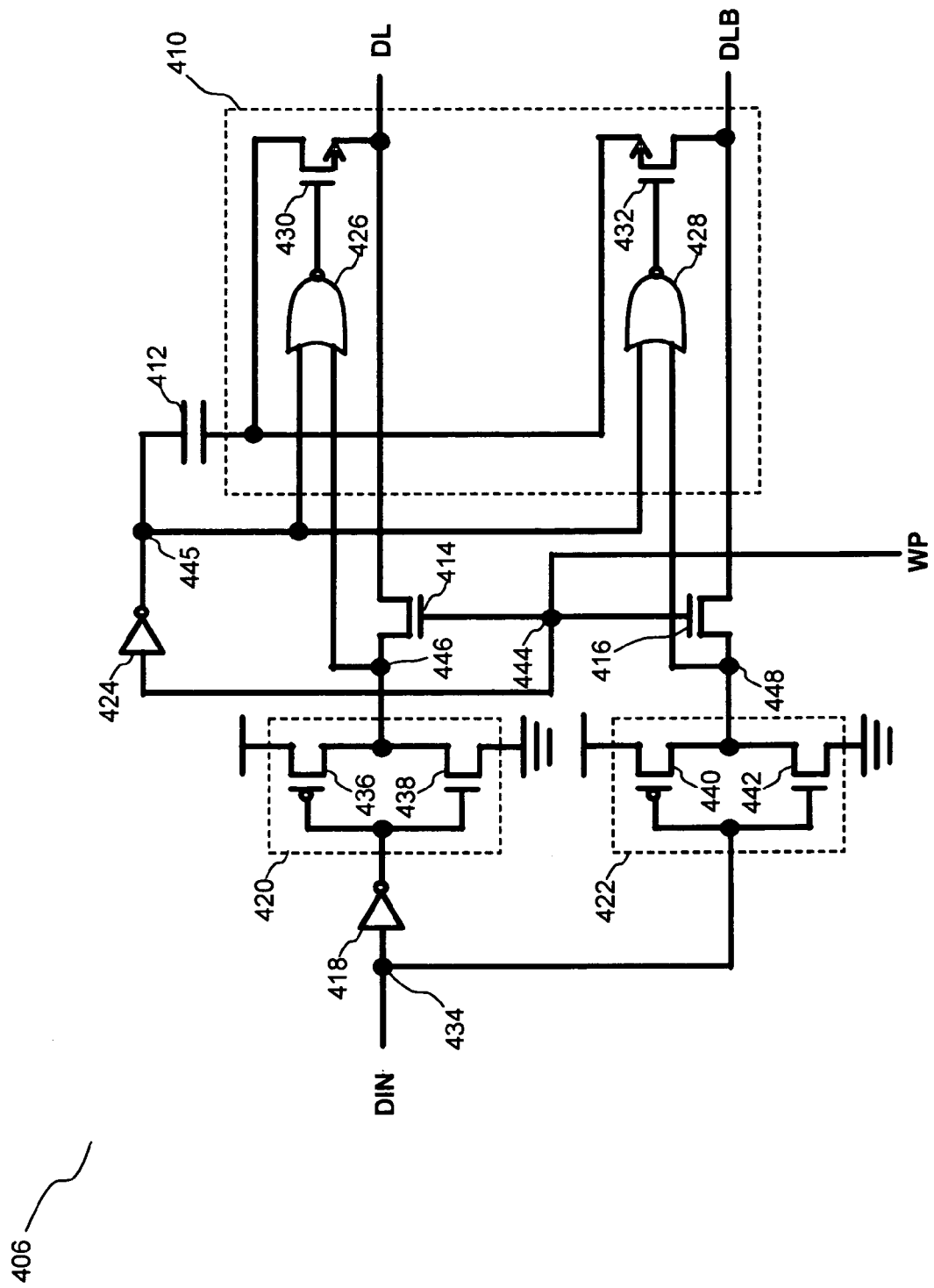
FIG. 4B illustrates a circuit diagram of a write buffer for generating a negative voltage during write operation of an SRAM cell in accordance with one embodiment of the present invention.

FIG. 4B illustrates a circuit diagram of the write buffer 406 in FIG. 4A that is capable of generating a negative voltage during the write operation of a logic "0" in accordance with one embodiment of the present invention. The write buffer 406 comprises a multiplexer 410, a boosting capacitor 412, two NMOS pass-gate transistors 414 and 416, and four inverters 418, 420, 422, and 424. The multiplexer 410 comprises two NOR gates 426 and 428 and two NMOS pass-gate transistors 430 and 432. The write buffer 406 is provided with two input signals: the data input signal DIN as well as the write control signal WP from the write pulse generator 408 shown in FIG. 4A. The data input signal DIN, which determines the states of the data line DL and the inverse data line DLB, is provided at a node 434. The data input signal DIN is inverted by the inverter 418 before reaching the inverter 420, which includes a PMOS transistor 436 and an NMOS transistor 438, while the same data input signal DIN is provided directly to the inverter 422, which includes a PMOS transistor 440 and an NMOS transistor 442.

The write control signal WP is provided to the gates of the NMOS pass-gate transistors 414 and 416 through a node 444. Initially, before write operation, the write control signal WP is set at a low state, thereby allowing the NMOS pass-gate transistors 414 and 416 to remain at off states. The inverter 424, whose input is coupled to the node 444, inverts the write control signal WP and provides a node 445 with a high signal that charges up the capacitor 412 to a higher potential. The high signal at the node 445 is also provided to the first input terminals of both NOR gates 426 and 428. This ensures that both the NOR gates 426 and 428 will output low signals, which keeps the NMOS pass-gate transistors 430 and 432 at off states when the write buffer 406 is not in a write mode.

When the write control signal WP is switched to a high state to enable a write operation, the NMOS pass-gate transistor 414 and 416 are turned on, thereby allowing the data lines DL and DLB to be supplied with positive or negative voltage signals, depending on the data input signal DIN. The apparatus and method for generating a negative voltage signal will be described below. The inverter 424, which is also coupled to the node 444, will now provide the node 445 with a low signal. The low signal at the node 445 will quickly discharge the capacitor 412 to a low potential, while providing the first input terminals of the NOR gates 426 and 428 with a low signal.

The second terminal of the NOR gate 426 is coupled to a node 446 between the inverter 420 and the NMOS pass-gate transistor 414, and the second terminal of the NOR gate 428 is coupled to a node 448 between the inverter 422 and the NMOS pass-gate transistor 416. This means that the two NOR gates 426 and 428 are designed to output signals of opposite states during a write operation. During a write operation, only one, but not both, of the NMOS pass-gate transistors 430 or 432 will be turned on. For example, when the terminal 446 is low, the NMOS transistor 430 is turned on, but the NMOS transistor 432 is turned off because the terminal 448 is high and the NOR gate outputs a low signal.

The transistor 430 functions as a switch to control the voltage level of the capacitor 412. For the capacitor 412 to generate a lower voltage than that of the data line DL, the capacitor 412 must be discharged before it is connected to the data line DL. During the write operation of logic "0", the data input signal DIN is low and the write control signal WP is high, thereby pulling the data line DL and the capacitor 412 to a ground level. Since the capacitor retains a low voltage across it, a low voltage of the data line DL effectively further lowers the capacitor voltage due to the negative charge pumping action of the capacitor 412 at the moment the NMOS transistor 430 is turned on. With this configuration, the multiplexer 410 ensures that one of the data lines DL and DLB will be provided with a negative voltage.

As described above, if a selected SRAM cell within a SRAM cell array is to be programmed with a logic "0," the data input signal DIN will be switched low to turn on the NMOS transistor 438 within the inverter 420 as well as the PMOS transistor 440 within the inverter 420. This allows the node 446 to be pulled low to the ground and node 448 pulled up to the supply voltage. With the write control signal WP switched high, the NOR gate 426 outputs a high signal, thereby turning on the NMOS pass-gate transistor 430 and allowing the capacitor 412 to provide a negative voltage to the data line DL. Meanwhile, the NOR gate 428 outputs a low signal, thereby allowing the NMOS pass-gate transistor 432 to remain at an off state and keeping the inverse data line DLB high.

If a selected SRAM cell within a SRAM cell array is to be programmed with a logic "1," the data input signal DIN will be switched high to turn on the PMOS transistor 436 within the inverter 420 as well as the NMOS transistor 442 within the inverter 422. This allows the node 446 to be pulled up to the supply voltage and the node 448 pulled low to ground. With the write control signal WP switched high, the NOR gate 426 outputs a low signal, thereby allowing the NMOS pass-gate transistor 430 to remain at an off state and keeps the data line DL high. Meanwhile, the NOR gate 428 outputs a high signal and turns on the NMOS pass-gate transistor 432, thereby allowing the capacitor 412 to provide a negative voltage boost to the data-bar line DLB. With an estimated 2 mA discharge current needed during a write cycle, the proposed write buffer that can generate a negative voltage needs an additional layout area by only 2%, while the conventional voltage switch circuit requires an additional 10-15% of layout area.

Figure 5:
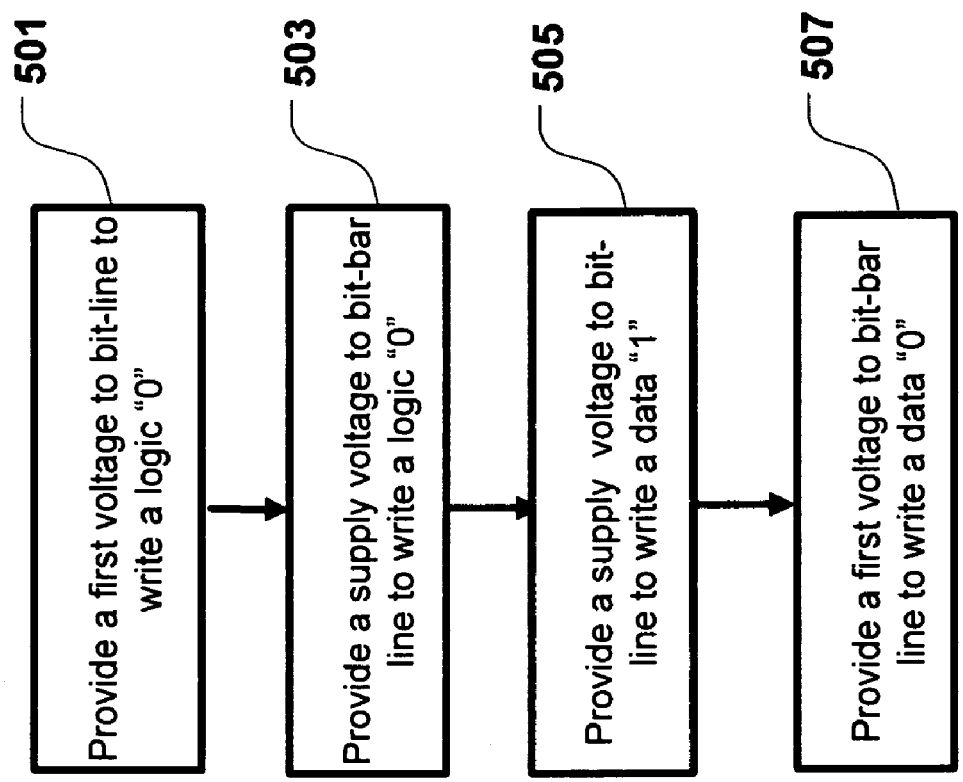
FIG. 5 illustrates a process flow diagram showing a write operation and a read operation of an SRAM cell in accordance with one embodiment of the present invention.

FIG. 5 illustrates a process flow diagram 500 showing a write operation and a read operation in accordance with one embodiment of the present invention. In process 501, a first voltage, which is lower than the device ground is provided to a bit-line selected. In process 503, a supply voltage is provided to an inverse bit-line during a write operation of a logic "0" in accordance with an embodiment of the present invention. In process 505, a supply voltage is provided to a bit-line selected. In process 507, a first voltage is provided to an inverse bit-line during a write operation of a logic "1" in accordance with an embodiment of the present invention.

The above illustration provides many different embodiments or embodiments for implementing different features of the invention. Specific embodiments of components and operation are described to help clarify the invention. These are, of course, merely embodiments and are not intended to limit the invention from that described in the claims.

From the above description, it will be apparent that the invention disclosed herein provides a novel and advantageous SRAM cell with improved read and write margins. The foregoing discussion discloses and describes merely exemplary methods and embodiments of the present invention. As will be understood by those familiar with the art, the invention may be embodied in other specific forms without departing from the spirit or essential characteristics thereof. For example, the present invention can be applied to other types of memory devices where a negative voltage can be applied to a bit-line or an inverse bit-line to improve a write margin. Accordingly, the disclosure of the present invention is intended to be illustrative, but not limiting, of the scope of the invention, which is set forth in the following claims.

What is claimed is:

1. A method for operating an SRAM device coupled with a bit-line, an inverse bit-line, a supply voltage, and a device ground comprising:
    providing a first voltage to the bit-line and the supply voltage to the inverse bit-line during a write operation of a logic "0" for increasing a first potential difference between the bit-line and the inverse bit-line; and
    providing the supply voltage to the bit-line and the first voltage to the inverse bit-line during a write operation of a logic "1" for increasing the first potential difference, wherein the first voltage is lower than the device ground.

2. The method of claim 1, wherein the first voltage is negative.

3. The method of claim 1, wherein the SRAM device is not coupled with a supply voltage switch for the purpose of switching the supply voltage.

4. The method of claim 1, wherein the SRAM device is not coupled with a logic circuit for the purpose of detecting column addresses and providing control signals to switch the supply voltage between a read operation and a write operation.

5. A write buffer for generating a negative voltage for a write operation of an SRAM device coupled with a data line, an inverse data line, a supply voltage, and a device ground, the write buffer comprising:
    a first inverter and a second inverter coupled in series for generating a first output signal to the data line through a first NMOS pass-gate transistor in response to a data input signal;
    a third inverter for generating a second output signal to the inverse data line through a second NMOS pass-gate transistor in response to the data input signal, wherein the first output signal and the second output signal are complementary;
    a fourth inverter having an input terminal coupled to a write control signal and an output terminal generating an inverted write control signal;
    a boosting capacitor coupled to the output terminal of the fourth inverter for generating the negative voltage when the write control signal is at a high state; and
    a multiplexer for providing the negative voltage generated by the boosting capacitor to the data line and the supply voltage to the inverse data line during a write operation of a logic "0" with the data input signal being low and the write control signal being high.

6. The write buffer of claim 5, wherein the first NMOS pass-gate transistor and the second NMOS pass-gate transistor are turned on when the write control signal is high.

7. The write buffer of claim 5, wherein the negative voltage is provided to the inverse data line and the supply voltage is provided to the data line during a write operation of a logic "1" when the data input signal is high and the write control signal is high.

8. The write buffer of claim 5, wherein the negative voltage is lower than the device ground after the write control signal is switched high.

9. The write buffer of claim 5, wherein during a write operation of a logic "0," the write buffer provides the negative voltage to a column decoder, which forwards the negative voltage to a bit-line of a selected SRAM cell.

10. The write buffer of claim 5, wherein during a write operation of a logic "1," the write buffer provides the negative voltage to the column decoder, which forwards the negative voltage to an inverse bit-line of a selected SRAM cell.

11. A method for operating a semiconductor memory device coupled with a data line, an inverse data line, a supply voltage, and a write buffer for generating a first voltage for a write operation, the method comprising:
    providing the first voltage to a data line and the supply voltage to the inverse data line during a write operation of a logic "0" to increase a write margin; and
    providing the supply voltage to the data line and the first voltage to the inverse data line during a write operation of a logic "1", wherein the first voltage is a negative voltage.

12. The method of claim 11, wherein the memory device is a single-port SRAM device.

13. The method of claim 11, wherein the write operation of the memory device is enabled when a write control signal is switched high.

14. The method of claim 13, wherein the supply voltage is provided to the data line and the first voltage is provided to the inverse data line during the write operation of a logic "1" when a data input signal is high and the write control signal is high.

15. The method of claim 13, wherein the negative voltage is generated when the write control signal is switched high.

16. The method of claim 11, wherein during the write operation of a logic "0," the write buffer provides the first voltage to a column decoder, which forwards the negative voltage to a bit-line of a selected memory cell.

17. The method of claim 16, wherein during a write operation of a logic "1," the write buffer provides the first voltage to the column decoder, which forwards the negative voltage to an inverse bit-line of a selected memory cell.

18. The method of claim 17, wherein the write margin is a potential difference between the bit-line and the inverse bit-line.

* * * * *